United States Patent
Yoon

(10) Patent No.: US 6,903,992 B1
(45) Date of Patent: Jun. 7, 2005

(54) REPAIR FUSE BOX OF SEMICONDUCTOR DEVICE

(75) Inventor: Seok Cheol Yoon, Chungcheongbuk-do (KR)

(73) Assignee: Hynix Semconductor Inc., Kyungki-Do (KR)

( * ) Notice: Subject to any disclaimer, the term of this patent is extended or adjusted under 35 U.S.C. 154(b) by 0 days.

(21) Appl. No.: 10/743,939

(22) Filed: Dec. 23, 2003

(30) Foreign Application Priority Data

Nov. 13, 2003 (KR) .................................. 10-2003-0080046

(51) Int. Cl.⁷ ................................................. G11C 7/00
(52) U.S. Cl. ..................................... 365/225.7; 365/200
(58) Field of Search .............................. 365/225.7, 200, 365/230.06

(56) References Cited

U.S. PATENT DOCUMENTS

| | | | | |
|---|---|---|---|---|
| 4,829,480 A | * | 5/1989 | Seo .............................. | 365/200 |
| 5,325,334 A | * | 6/1994 | Roh et al. ..................... | 365/201 |
| 5,614,855 A | | 3/1997 | Lee et al. ..................... | 327/158 |
| 5,815,016 A | | 9/1998 | Erickson ....................... | 327/158 |
| 5,875,219 A | | 2/1999 | Kim ............................. | 375/376 |
| 5,959,904 A | * | 9/1999 | Oh .............................. | 365/200 |
| 6,222,894 B1 | | 4/2001 | Lee .............................. | 375/376 |
| 6,326,826 B1 | | 12/2001 | Lee et al. ..................... | 327/161 |
| 6,340,904 B1 | | 1/2002 | Manning ....................... | 327/156 |
| 6,470,060 B1 | | 10/2002 | Harrison ....................... | 357/374 |
| 6,504,408 B1 | | 1/2003 | von Kaenel ................... | 327/158 |
| 6,556,489 B2 | | 4/2003 | Gomm et al. ................. | 365/194 |
| 2002/0130691 A1 | | 9/2002 | Silvestri ....................... | 327/158 |
| 2003/0011414 A1 | | 1/2003 | Bell ............................. | 327/233 |
| 2003/0085744 A1 | | 5/2003 | Heo et al. ..................... | 327/158 |

FOREIGN PATENT DOCUMENTS

JP 11259167 9/1999 ............. G06F/1/10

* cited by examiner

*Primary Examiner*—Vu A. Le
(74) *Attorney, Agent, or Firm*—Marshall, Gerstein & Borun LLP

(57) ABSTRACT

Provided is a repair fuse box of a semiconductor device comprising: a plurality of fuse boxes arranged in a longitudinal direction, each fuse box comprising a plurality of fuses arranged in a transverse direction; signal connecting fuses arranged in each side portion of outermost fuses of the fuses which are selected from the fuses arranged in one or more fuse boxes of the plurality of fuse boxes to construct a unit fuse set and of which one side ends are connected mutually, the signal connecting fuses being connected to the outermost fuses; and metal lines for connecting the signal connecting fuses to the fuses selected to construct a unit fuse box in an upper or lower fuse box. According to the present invention, it is possible to connect fuses together without detour of the metal lines and to considerably reduce a chip size.

3 Claims, 3 Drawing Sheets

REPAIR FUSE BOX OF SEMICONDUCTOR DEVICE

BACKGROUND

1. Field of the Invention

The present invention relates to a repair fuse box of a semiconductor device and, more specifically, to a repair fuse box having a structure in which a signal line can be drawn out from a repair fuse box without detour.

2. Discussion of Related Art

Recently, high-speed and highly integrated semiconductor devices have been developed with development of miniaturization technologies. In particular, high integration and high yield of semiconductor memory devices have been required, and in order to cope with the requirements, a redundancy technology, which improves a yield by providing redundancy circuits and repairing defective cells using the redundancy circuit, is essential.

In memory devices such as SRAM, DRAM, EPROM, and so on, redundancy circuits are provided in the semiconductor devices to prevent decrease of yields of the semiconductor devices due to process defects. The functions of the semiconductor devices are not damaged in spite of partial defects, by repairing defective cells using the provided redundancy circuits. That is, by providing a spare memory array as a redundancy circuit and switching a main memory array into the spare memory array when the main memory array is defective, decrease of production yield can be regulated.

The redundancy circuit comprises a repair address generating circuit. A conventional repair address generating circuit has a structure shown in FIG. 1, and its operation will be explained briefly as follows.

A fuse set A comprises a plurality of fuses R0 to R15.

When an enable signal Enable is in a high state, a PMOS transistor P1 is turned off, and thus its output Out holds a low state.

When the enable signal Enable is in a low state, the output Out is changed in accordance with fuse control signals Fuse <0> to Fuse <15> and cutting states of the fuses R0 to R15.

For example, when the fuse control signal Fuse <0> is in a high state and the first fuse R0 is not cut, the NMOS transistor Q0 is turned on. Then, an output of a latch 10 is in a high state, and thus an output of the inverter I1 turns to a low state, so that the output Out turns to a low state. However, when the fuse R0 is cut, the output Out turns to a low state even if the fuse control signal Fuse <0> turns to a high state.

When forming the fuses in a fuse box shape to form the repair address generating circuit, metal signal lines cannot pass over the fuse box. Therefore, the metal signal line should detour around the fuse box for signal routing, and this make a chip size larger.

SUMMARY OF THE INVENTION

In order to solve the above problems, the present invention is directed to a repair fuse box of a semiconductor device.

According to an aspect of the present invention, there is provided a repair fuse box of a semiconductor device comprising: a plurality of fuse boxes arranged in a longitudinal direction, each fuse box comprising a plurality of fuses arranged in a transverse direction; signal connecting fuses arranged in each side portion of outermost fuses of the fuses which are selected from the fuses arranged in one or more fuse boxes of the plurality of fuse boxes to construct a unit fuse set and of which one side ends are connected mutually, the signal connecting fuses being connected to the outermost fuses; and metal lines for connecting the signal connecting fuses to the fuses selected to construct a unit fuse box in an upper or lower fuse box.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Now, the present invention will be described in detail with reference to the accompanying drawings.

Figure 1:
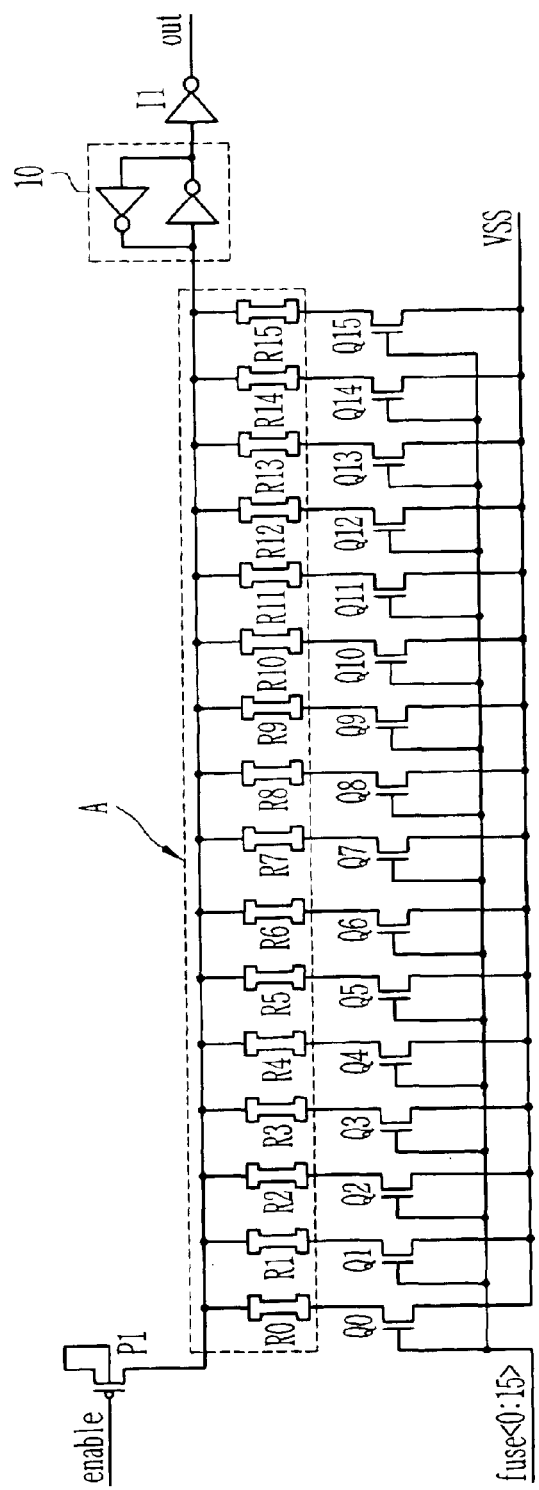
FIG. 1 is a circuit diagram of a conventional repair address generating circuit.
Figure 2:
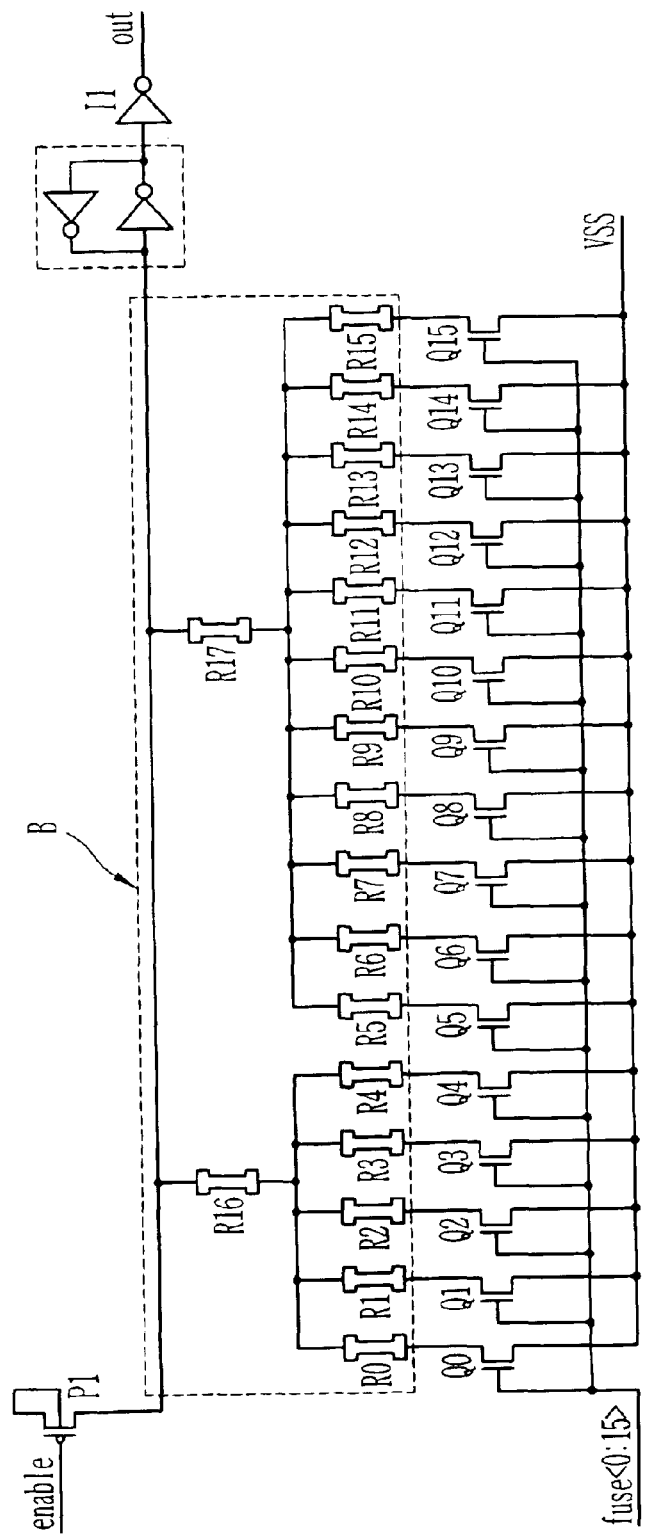
FIG. 2 is a circuit diagram of a repair address generating circuit according to the present invention.

FIG. 2 is a circuit diagram of a repair address generating circuit according to the present invention.

The repair address generating circuit according to the present invention further comprises signal connecting fuses R16 and R17. The signal connecting fuses R16 and R17 can be made of any kind of materials as long as it is a conductive material. The operation of the circuit is not different from the operation of the conventional circuit. The operation will be described.

A fuse set B comprises a plurality of fuses R0 to R15 and signal connecting fuses R16 and R17.

When an enable signal Enable is in a high state, a PMOS transistor P1 is turned off, and thus an output Out of the circuit always holds a low state.

When the enable signal Enable is in a low state, the output Out of the circuit is changed in accordance with the fuse control signals Fuse <0> to Fuse <15> and the cutting states of the fuses R0 to R15.

For example, when the fuse control signal Fuse <0> is in a high state and the first fuse R0 is not cut, the NMOS transistor Q0 is turned on. Then, an output of a latch 10 is in a high state, and thus an output of the inverter I1 is in a low state, so that the output Out of the circuit turns to a low state. However, when the fuse R0 is cut, the output Out of the circuit turns to a low state even if the fuse control signal fuse <0> is in a high state.

Figure 3:
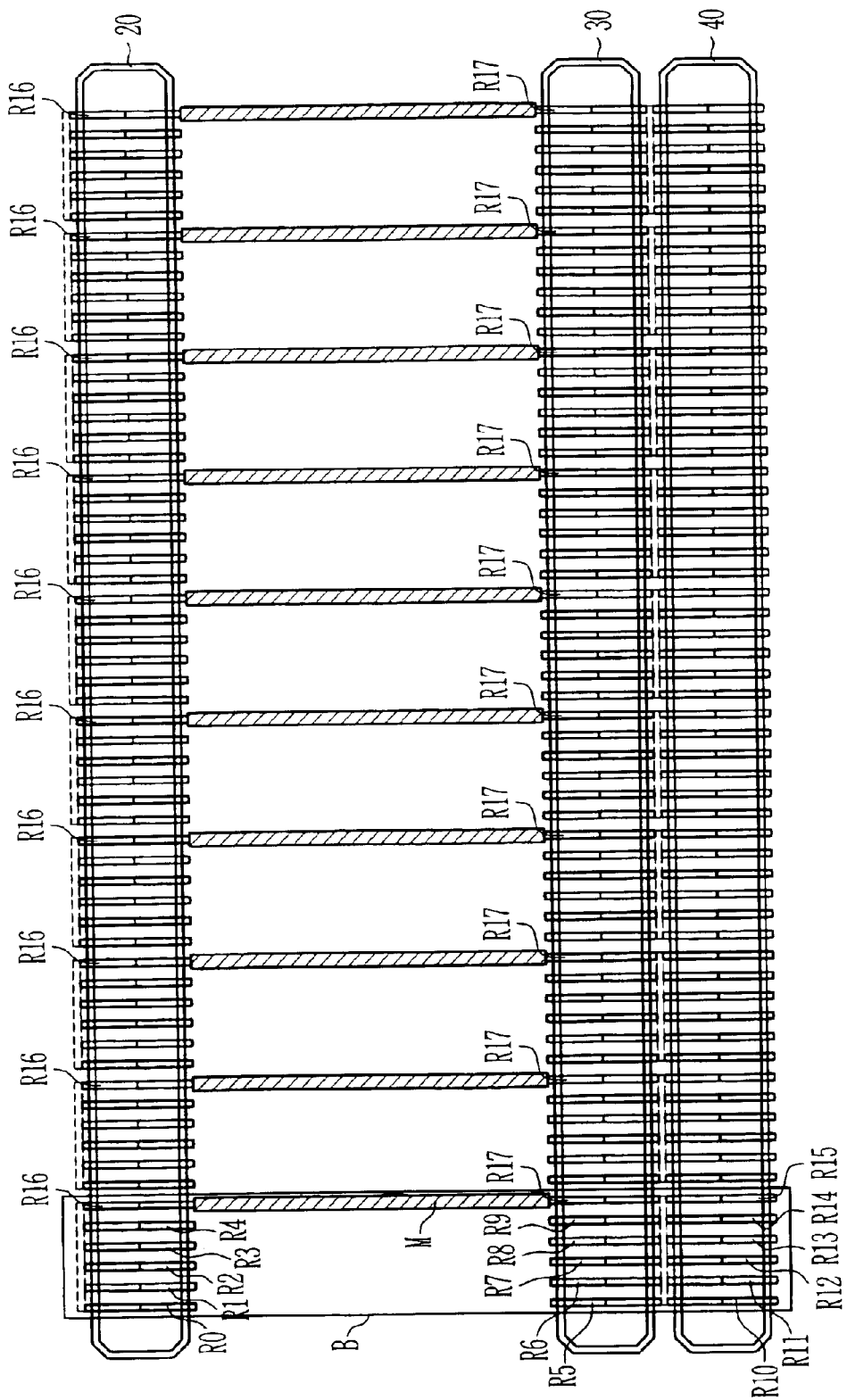
FIG. 3 is a layout diagram of a repair fuse box circuit according to the present invention.

FIG. 3 is a layout diagram of the repair fuse box according to the present invention for explaining how the fuses of the fuse set B of FIG. 2 are embodied in a substrate.

Fuse boxes 20, 30 and 40 are shown in FIG. 3. The configuration of the fuse set B for constructing the circuit of FIG. 2 will be explained as follows.

The fuses R0 to R4 are arranged in the fuse box 20, and a signal connecting fuse R16 is arranged to the left side of the fuse R4. Upper end portions of the fuses R0 to R4 and the signal connecting fuse R16 are connected together through a metal, and so on.

In the same manner, the fuses R5 to R9 are arranged in the fuse box 30, and a signal connecting fuse R17 is arranged to the left side of the fuse R9. Lower end portions of the fuses R5 to R9 and the signal connecting fuse R17 are connected together through a metal, and so on.

The signal connecting fuses R16 and R17 are connected together through a metal line M by using a contact process, and so on.

The fuses R10 to R15 are arranged in the fuse box 40. Upper end portions of the fuses R10 to R15 are not only connected together through a metal, and so on, but also connected to the fuse box 30.

As a result, one side nodes of the fuses R0 to R15 shown in FIG. 2 are all connected each other through the signal connecting fuses R16 and R17.

It should be noted that opened terminals of the fuses are connected to transistors.

Since the signal connecting fuses R16 and R17 are used for signal connection, they are not the cutting targets.

According to the present invention as described above, it is possible to connect the fuses without detour of the metal lines by using the fuse boxes.

As a result, since the signal routing can be implemented by using the fuses, it is possible to considerably reduce a chip size.

Although the foregoing description has been made with reference to the preferred embodiments, it is to be understood by the ordinary skilled in the art that changes and modifications of the present invention may be made without departing from the spirit and scope of the present invention and appended claims.

What is claimed is:

1. A repair fuse box of a semiconductor device comprising:

a plurality of fuse boxes arranged in a longitudinal direction, each fuse box comprising a plurality of fuses arranged in a transverse direction;

signal connecting fuses arranged in each side portion of outermost fuses of the fuses which are selected from the fuses arranged in one or more fuse boxes of the plurality of fuse boxes to construct a unit fuse set and of which one side ends are connected mutually, the signal connecting fuses being connected to the outermost fuses, wherein the signal connecting fuses are not cut under repair; and metal lines for connecting the signal connecting fuses to the fuses selected to construct a unit fuse box in an upper or lower fuse box.

2. The repair fuse box of a semiconductor device according to claim 1, wherein a connection point of the signal connecting fuses and the outermost fuses is connected to an output terminal of an enable transistor in a repair address generating circuit.

3. The repair fuse box of a semiconductor device according to claim 1, wherein the signal connecting fuses and the fuses in the upper or lower fuse box are connected mutually through a contact process.

* * * * *